United States Patent [19]

Just

[11] 4,155,402
[45] May 22, 1979

[54] COMPLIANT MAT COOLING

[75] Inventor: Anthony H. Just, New Brighton, Minn.

[73] Assignee: Sperry Rand Corporation, New York, N.Y.

[21] Appl. No.: 756,163

[22] Filed: Jan. 3, 1977

[51] Int. Cl.² .......................... H05K 7/20; F28F 7/00
[52] U.S. Cl. ................................ 165/46; 165/105; 361/368; 174/16 HS
[58] Field of Search .............. 165/46, 80; 174/16 HS; 361/386–388

[56] References Cited

U.S. PATENT DOCUMENTS

| | | | |
|---|---|---|---|
| 3,593,064 | 7/1971 | Wagner | 368/388 |
| 3,689,804 | 9/1972 | Ishihama et al. | 361/386 |
| 4,072,188 | 2/1978 | Wilson et al. | 165/80 |

OTHER PUBLICATIONS

IBM Technical Disclosure Bulletin (vol. 20#5), Oct. 1977 (pp. 1966 & 1967).

Primary Examiner—Charles J. Myhre
Assistant Examiner—Theophil W. Streule, Jr.
Attorney, Agent, or Firm—Douglas L. Tschida; Kenneth T. Grace; Marshall M. Truax

[57] ABSTRACT

A printed circuit board package for high density packaging of electronic circuit components is disclosed. The circuit components are cooled by a liquid cooled, cold plate with a compliant mat interface. The interface is made of a heat conductive, electrically insulative compliant structure, such that uniform contact can be made with the circuit components, even if there are differences in the relative heights and shapes of the components.

6 Claims, 7 Drawing Figures

COMPLIANT MAT COOLING

BACKGROUND OF THE INVENTION

As computer speeds are increased, it becomes necessary to package circuitry at increasingly greater densities. One method for achieving this is to put the active circuit chips in smaller packages and position these packages as close together as possible on a printed circuit board. As this is done however, heat densities rise, sometimes beyond the cooling capabilities of forced air convection. It then becomes necessary to resort to cold plates or other heat removing devices.

One way to achieve good cooling of high density packaging is to place a liquid cooled, cold plate in direct contact with the circuit package. To do so, however, is difficult due to variations in dimensional tolerances and in the relative heights and shapes of the circuit components on a printed circuit board. This problem may be alleviated through the use of a compliant interface between the cold plate and the circuit components. Such an interface must be forgiving of any variations or irregularities; it must be deformable so as to comply with the surfaces of the individual circuit packages. It is also desirable that the interface be made of a material that is heat conductive and electrically insulative, since the contact resistance decreases as a more intimate contact is made between the cold plate and the heat generating circuit components and to prevent electrical shorts between the cold plate and circuit components.

Many different resilient materials and structures have been tried in attempts to achieve a compliant interface. Some of those suggested have been a mat consisting of rubber tubing, U.S. Pat. No. 3,833,836; a cellular or honeycomb structure, U.S. Pat. No. 3,302,067; a multi-parallel leaf padding means, U.S. Pat. No. 3,212,564; wire mesh strips, U.S. Pat. No. 3,267,333; an enclosure for liquid immersion, U.S. Pat. Nos. 3,851,221 and 3,124,720; and a gelled cooling cushion, U.S. Pat. No. 3,802,220.

A paste and film interface as disclosed herein has been found to provide a more compliant interface for packaging electric circuit components than the previously used resilient structures. The circuitry is also more accessible and the coolant is more economical than previously used flurocarbons. Tests have shown the paste mixture used herein to possess good heat transfer characteristics and the film used to contain the paste also provides electrical insulation between the interface and the components, since the paste contains metal particles. In combination the paste and film provide a better mating between the cold plate and the circuit components of a variety of shapes and different heights, and thereby provides better heat transfer over an increased contact surface area.

SUMMARY OF THE INVENTION

The present invention discloses a liquid cooled, cold plate with a new and improved compliant mat interface bonded to the cooling face thereof. The interface is composed of a thin film, bonded to the cold plate, which contains a heat absorbing paste and electrically insulates the paste from electrical components in contact with the mat interface. The paste flows like a highly viscous liquid and will conform to the contours of objects brought in contact therewith.

The liquid cooled, cold plate with a compliant mat interface can be combined with a printed circuit board containing a plurality of circuit components of various sizes and shapes to form an integral package. The cold plate when fastened to the printed circuit board provides intimate contact with the circuit components, due to the flow of the paste. The paste flows such that the film and paste will comply with the contours of the circuit components on the board. This mating will be at a low unit pressure, per circuit component, which unit pressure will be equal over the entire surface of the mat. Such a package with improved interfacing between the cold plate and circuit components permits denser packaging of circuitry.

The present invention also envisages an integral package containing two printed circuit boards and a liquid cooled, cold plate. The cold plate is constructed with a compliant mat interface attached to the top and bottom cooling faces. The cold plate is sandwiched between the two printed circuit boards and the combination is fastened together to form an integral package.

DESCRIPTION OF THE PREFERRED EMBODIMENT

Figure 2:
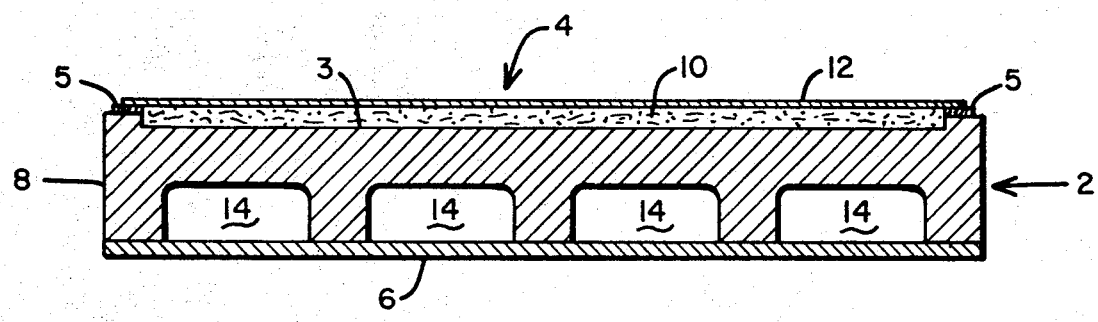
FIG. 2 is a cross section view of the cold plate in FIG. 1 along 2—2.

Referring to FIG. 2, a cross section view of a liquid cooled, cold plate 2 with a compliant mat interface 4 is shown. The cold plate is constructed of two basic parts; the backing plate 6 and the channeled cooling plate 8. The backing plate 6 and channeled cooling plate 8 are made from a material possessing good heat conducting properties, such as aluminum or copper, and may be formed by any suitable process, such as milling or casting. The channeled cooling plate 8 contains a continuous, serpentine channel 14 which terminates at a supply port 16 and a return 17 port. The channel 14 may be in any configuration, and may provide turbulent or laminar flow, but in the embodiment described herein, turbulent flow is generated by the sharp corners within the channel. A recessed area 3 is formed into the exterior face of the channeled cooling plate 8, and it is within this recess 3 that the heat conductive paste 10 is contained.

The heat conductive paste 10 is a mixture of components, which has a thick paste-like consistency. In the preferred embodiment the paste 10 is made of quantities of ethylene glycol and copper flakes. Other possible combinations may use glycerol or ethylene glycol and copper or aluminum granules or flakes, or mixtures thereof.

The paste 10 is placed into the recess 3 on the channeled cooling plate 8 and a thin film 12 possessing electrical insulation properties is mounted over the paste 10. The thickness of the film 12 is on the order of 0.002 inch, and it is attached to the ridged portion of the exterior face of the cooling plate by an appropriate adhesive 5 (such as a rubber, acrylic or epoxy base adhesive).

Together the paste mixture 10 and thin film 12 form a compliant mat interface 4, which is heat conductive and electrically insulative. As liquids are circulated through the cold plate via the supply 16 and return 17 ports, heat generated by devices in contact with the interface 4 is transferred away from the device and absorbed by the interface 4, cold plate 2 and liquid. A liquid mixture which might be used as the circulant could consist of water, ethylene glycol, anti-foaming additives and anti-corrosion additives.

Figure 1:
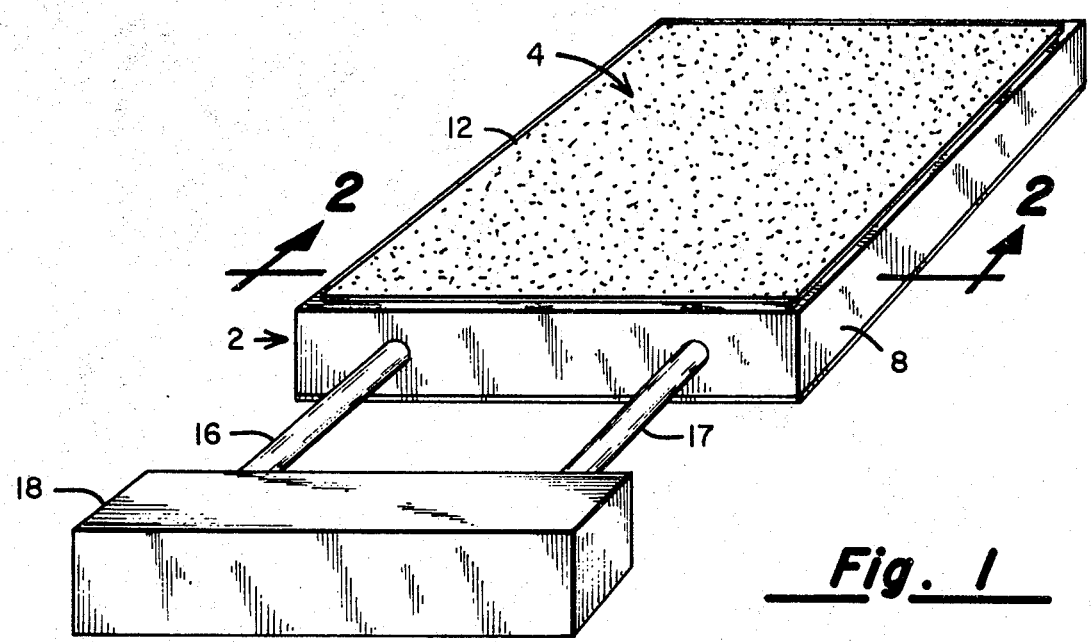
FIG. 1 illustrates a typical liquid cooled cold plate with a compliant mat inteface and circulating means.

FIG. 1 shows a three dimensional view of the cold plate with compliant mat interface 4 and circulating means 18. The compliant mat 4, when not in contact with heat generating devices, forms a flat continuous plane. When the cold plate with compliant mat interface is in contact with heat generating devices, the liquid coolant is circulated through the cold plate 2. Heat is absorbed by the compliant mat 4, cold plate 2 and liquid and is carried away via the liquid to the return side of the circulating means 18, where the heat is removed by a heat exchanger or chiller.

Figure 3:
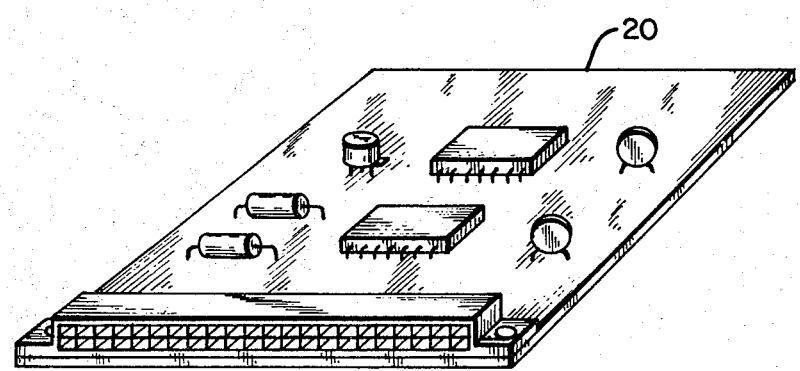
FIG. 3 illustrates a typical printed circuit board and a plurality of components mounted thereon.

The liquid cooled, cold plate 2 with the compliant mat interface 4, FIGS. 1, 2, can be used in conjunction with a printed circuit board 20, containing a plurality of circuit components. A printed circuit board 20 with a representative variety of circuit elements is shown in FIG. 3. In a cross section view of the board and mat interface in compression, FIG. 4, however, it can be seen that the relative mounting heights of the same type of components 21 can vary with respect to the distance from the top of the component 21 to the face of the printed circuit board 20. The shapes of various components will also vary and consequently it is difficult to cool the components by bringing the cold plate in contact with the top of a board.

Using resilient structures similar to those previously mentioned as an interface does not provide the compliance that a paste film mat does. An elastomer provides good compliancy but testing of the paste 10 and metal filled elastomers has shown the paste 10 to provide better heat absorption than elastomers. Maximum contact with circuit components can be achieved by using liquid coolants and immersing the components therein,—see U.S. Pat. Nos. 3,124,720 and 3,851,221—but to achieve less costly cooling and facilitate access to the printed circuit boards, a compliant interface is preferred. The thickness (typically 0.040 to 0.060 inch, where IC chips are used) of the compliant mat 4 can be varied by the amount of paste 10 used and thereby the compliancy of the mat can be varied to provide uniform contact at low unit pressure with the components on the printed circuit board and to fill the gaps between components.

Figure 4:
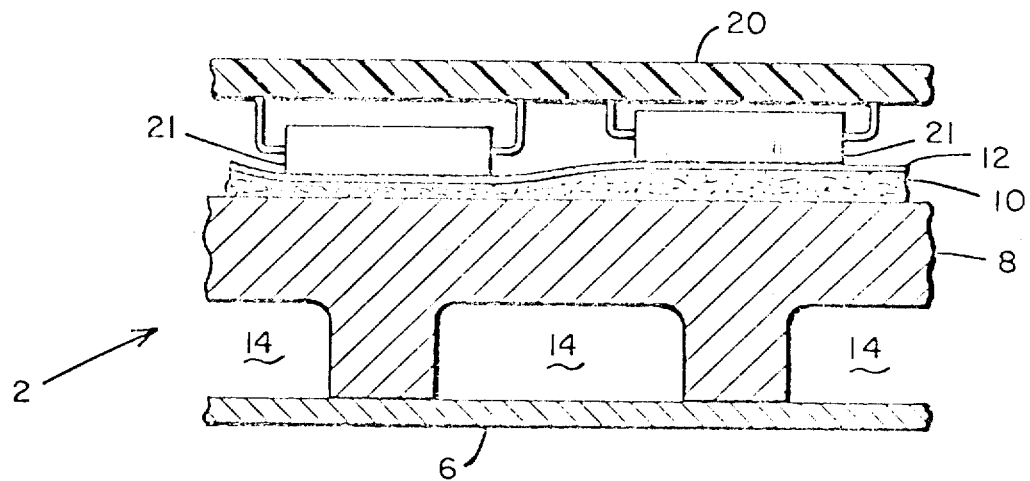
FIG. 4 is a partial cross section view of a liquid cooled cold plate with a compliant mat interface in compression with a printed circuit board, illustrating the compliancy of the interface to irregularities in circuit component mounting heights.
Figure 5:
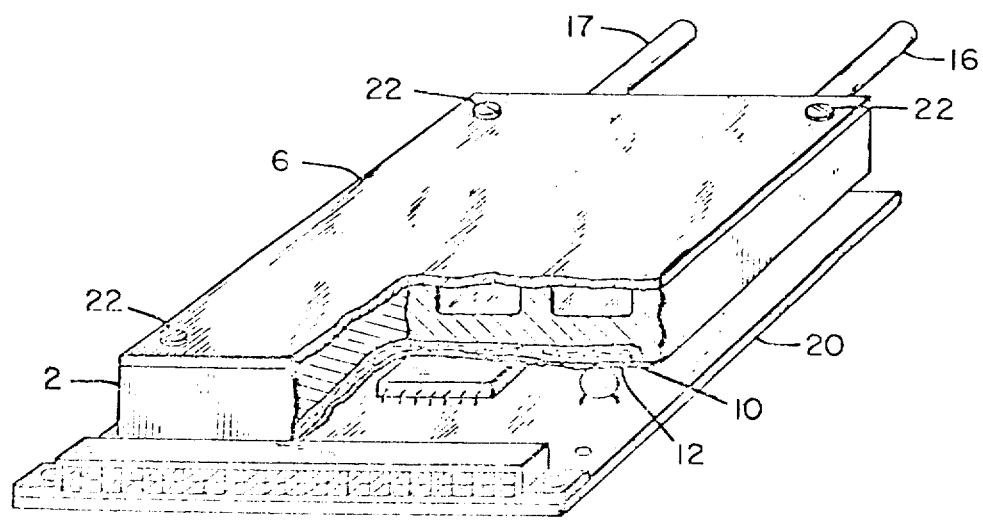
FIG. 5 is a three dimensional view of a modular package, comprised of a printed circuit board and a cold plate with a compliant mat interface.

FIG. 5 demonstrates an integral package, where the cold plate 2 with compliant mat interface 4 is positioned over the printed circuit board 20 and the combination is drawn together by through-bolts and nuts 22. The mat 4 will comply with the varying shapes and heights of the circuit components 21 as shown in FIG. 4, and provide a more efficient cooling by greater contact with a larger surface area.

Figure 6:
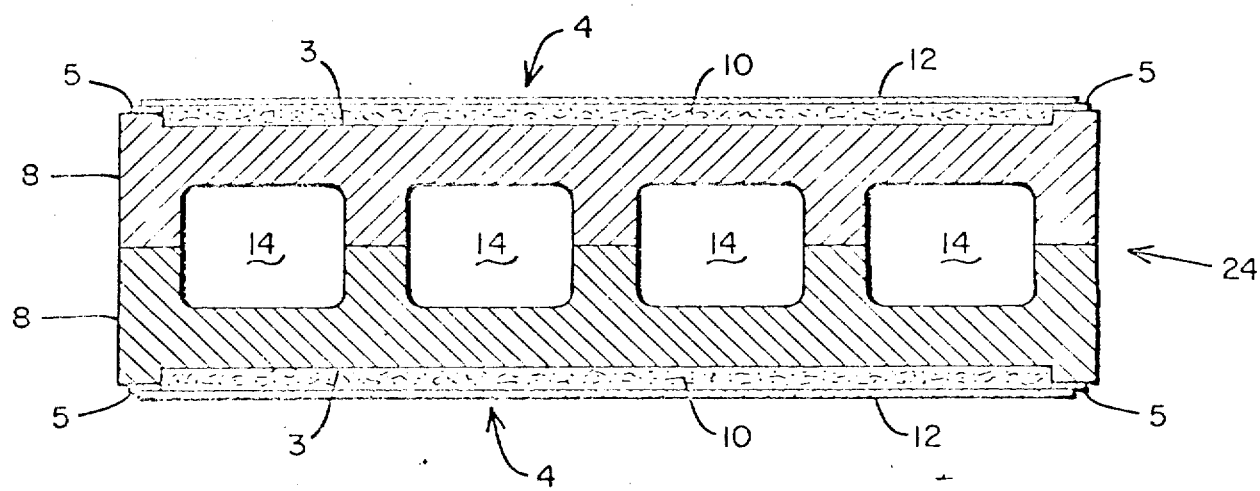
FIG. 6 is a cross section view of a liquid cooled cold plate with a compliant mat interface on its upper and lower cooling faces.
Figure 7:
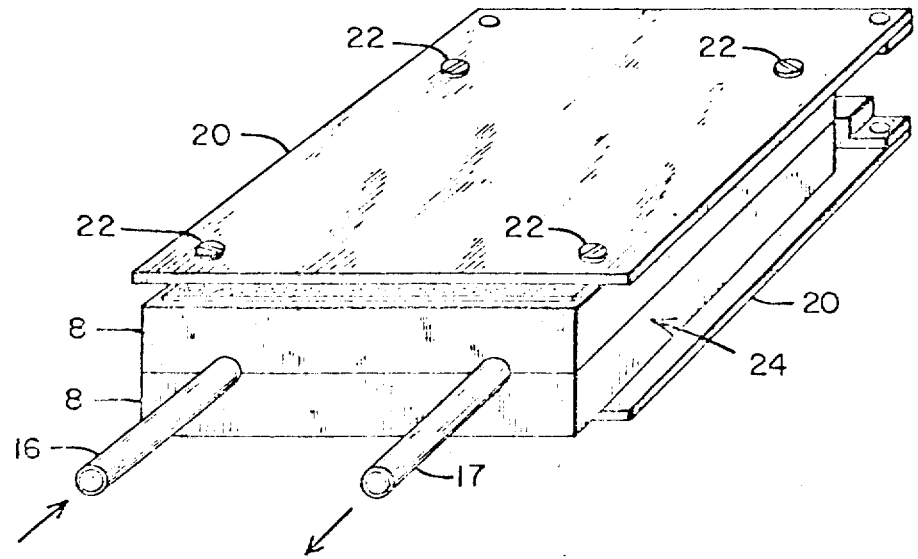
FIG. 7 illustrates a modular package using a cold plate with compliant mat interfaces on its upper and lower cooling faces to cool circuit components on two printed circuit boards.

FIGS. 6 and 7 show a further refinement and a denser packaging arrangement by sandwiching a liquid cooled cold plate 24 with a compliant mat interface 4 attached to the top and bottom recesses 3 of the cold plate 24. The cold plate 24 is similar to the cold plate 2 shown in FIGS. 1 and 2, except that instead of using a backing plate 6, another channeled cooling plate 8 with compliant mat interface 4 is bonded to the bottom of the channeled cooling plate 8. The new cold plate 24 is shown in cross section in FIG. 6 and in three dimension in FIG. 7. The new cold plate 24 possesses two compliant mat interfaces and in this manner both faces of the cold plate 24 can be used to provide cooling to additional components. A modular package using the cold plate 24 is shown in FIG. 7. The cold plate 24 is sandwiched between two printed circuit boards and the combination is fastened together by appropriate hardware such as through bolts and nuts 22.

The modular packages described herein can be used in a mother-daughter interconnection system. In such a system, the individual packages of FIGS. 5 and 7 are connected to a mother board by appropriate connecting means and further supported by a printed circuit board guide rack in a stacked arrangement, and the supply 16 and return 17 ports of the individual cold plates are connected to the respective supply and return side of the circulating apparatus 18 via supply and return manifolds.

What is claimed is:

1. A cold plate assembly for use in combination with printed circuit boards having circuit components mounted thereon, comprising:
    cold plate means for extracting heat from said circuit components;
    a deformable thin film;
    a heat conductive paste;
    sealing means sealing said heat conductive paste between said thin film and said cold plate means for forming a compliant mat interface in the area of said thin film;
    said compliant mat interface deforming to comply to irregularities on and between the contours of said circuit components mounted in compression with said compliant mat interface and creating a heat transfer relationship between said circuit components and said cold plate means.

2. A cold plate assembly as set forth in claim 1, wherein said thin film is electrically insulative.

3. A cold plate assembly for use in combination with printed circuit boards having circuit components mounted thereon, comprising:
    cold plate means having first and second surfaces for extracting heat from said circuit components;
    a first and a second deformable thin film;
    a heat conductive paste;
    sealing means sealing said heat conductive paste between each of said first and second surfaces and said respective first and second thin films for forming a first and a second compliant mat interface in the area of said first and second thin films;
    said first and second compliant mat interfaces deforming to comply to irregularities on and between the contours of said heat generating circuit components mounted in compression with said first and second compliant mat interfaces and creating a heat transfer relationship between said circuit components and said cold plate means.

4. A liquid cooled cold plate assembly for cooling circuit components, comprising:
   a frame having sidewalls, a first surface and a second surface, said sidewalls and said first and second surfaces circumscribing a cavity formed within said frame;
   supply and return means connected to said frame for circulating a liquid coolant through said cavity;
   a heat conductive paste;
   a deformable thin film;
   sealing means for sealing said heat conductive paste between said first surface and said thin film and forming a compliant mat interface in the area of said thin film;
   said compliant mat interface deforming to comply to irregularities on and between the surface contours of said circuit components mounted in compression with said compliant mat interface and creating a heat transfer relationship between said heat generating devices and said liquid coolant.

5. A liquid cooled cold plate assembly as set forth in claim 4 including a second compliant mat interface comprised of said heat conductive paste and a second deformable thin film sealed to said second surface of said frame.

6. A liquid cooled cold plate assembly for cooling circuit components, comprising:
   a frame having sidewalls, a first surface and a second surface, said sidewalls and said first and second surfaces circumscribing a serpentine cavity formed within said frame and said first and second surfaces each having a depression formed therein;
   supply and return means connected to said frame for circulating a liquid coolant through said serpentine cavity;
   a heat conductive paste;
   a first and a second deformable thin film;
   sealing means for sealing said heat conductive paste between said depression formed in said first and second surfaces and said respective first and second thin films and forming respective first and second compliant mat interfaces in the areas of said respective first and second thin films;
   said first and second compliant mat interfaces deforming to comply to irregularities on and between the surface contours of said circuit components mounted in compression with said first and second compliant mat interfaces and creating a heat transfer relationship between said circuit components and said liquid coolant.

* * * * *

UNITED STATES PATENT AND TRADEMARK OFFICE
CERTIFICATE OF CORRECTION

PATENT NO. : 4,155,402

DATED : May 22, 1979

INVENTOR(S) : Anthony H. Just

It is certified that error appears in the above-identified patent and that said Letters Patent are hereby corrected as shown below:

Figures 4, 5, 6 and 7 should be included in the

Printed Patent. (See attachment)

Signed and Sealed this

Sixteenth Day of October 1979

[SEAL]

Attest:

RUTH C. MASON
*Attesting Officer*

LUTRELLE F. PARKER
*Acting Commissioner of Patents and Trademarks*